United States Patent [19]

Bargain

[11] Patent Number: 5,152,694
[45] Date of Patent: Oct. 6, 1992

[54] INTERMEDIATE CONNECTOR BETWEEN PRINTED-CIRCUIT BOARD AND SUBSTRATE HAVING ACTIVE ELECTRONIC CIRCUITS

[75] Inventor: Raymond Bargain, Bezons, France

[73] Assignee: Souriau et Cie, Boulogne Billancourt, France

[21] Appl. No.: 789,200

[22] Filed: Nov. 12, 1991

[30] Foreign Application Priority Data

Nov. 12, 1990 [FR] France .................. 90 13996

[51] Int. Cl.⁵ .................. H01R 9/09; H01R 31/08
[52] U.S. Cl. .................. 439/66; 439/70; 439/81; 439/83; 439/514
[58] Field of Search ............. 439/66, 68–73, 439/81, 83, 513–515, 507

[56] References Cited

U.S. PATENT DOCUMENTS

| | | | |
|---|---|---|---|
| 4,370,017 | 1/1983 | Grabbe et al. | 439/188 |
| 4,645,279 | 2/1987 | Grabbe et al. | 439/70 |
| 4,898,539 | 2/1990 | Glover et al. | 439/81 |
| 4,927,369 | 5/1990 | Grabbe et al. | 439/66 |
| 4,969,826 | 11/1990 | Grabbe | 439/66 |
| 4,940,432 | 7/1990 | Consoli et al. | 439/862 |
| 4,978,308 | 12/1990 | Kaufman | 439/83 |
| 5,018,981 | 5/1991 | Matsooka | 439/514 |

FOREIGN PATENT DOCUMENTS 0055042 6/1982 European Pat. Off. .
0373003 6/1990 European Pat. Off. .

OTHER PUBLICATIONS

IBM Technical Disclosure Bulletin, vol. 12, No. 4, Sep. 1969, New York U.S., p. 595; Grandia, Kahn and Woods: "Rapid-loading, low-stress sample holder" p. 595, lines 9–11.

Primary Examiner—Paul A. Bradley
Attorney, Agent, or Firm—Larson and Taylor

[57] ABSTRACT

The connector comprises an insulating support 20 in which are provided uniformly spaced passages and electrical signal contacts, each intended to connect a pad and a track, which are arranged in at least some of the passages. The contacts are eac constituted by a cut-out sheet, having a relatively rigid portion comprising a branch for bearing on the lower face of the support and for connection with a track and a branch for fastening onto the support (20), extending towards the upper face and having a relatively flexible S-shaped portion whose proximal end is integral with the relatively rigid portion and whose distal end projects beyond the upper face of the support, the flexible portion having curvatures at rest such that the distal end is then away from the fastening branch and the passage having diemsnions such that it deforms the flexible portion when the contact is inserted into the support until it brings the distal portion into connection with the fastening branch, in order to constitute a short-circuit.

10 Claims, 3 Drawing Sheets

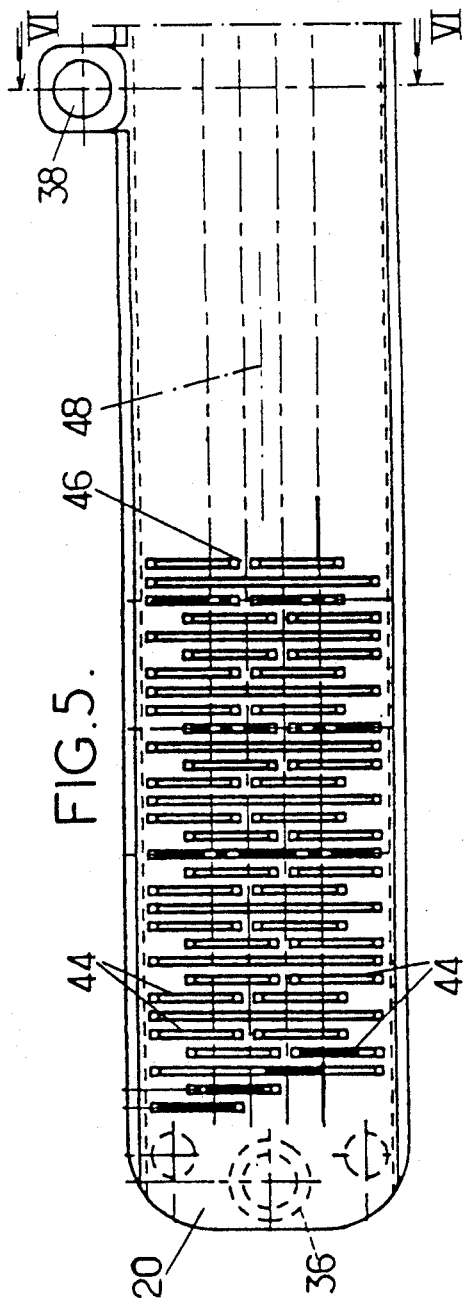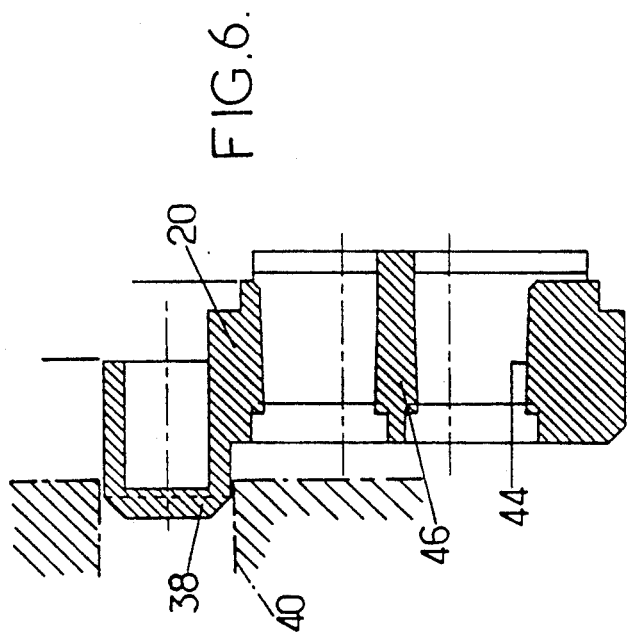

INTERMEDIATE CONNECTOR BETWEEN PRINTED-CIRCUIT BOARD AND SUBSTRATE HAVING ACTIVE ELECTRONIC CIRCUITS

The subject of the present invention is an intermediate connector intended to be inserted between a printed-circuit board and a substrate carrying active electronic circuits. It finds a particularly important, although not exclusive, application in ceramic-substrate devices and especially those carrying several integrated circuits.

There are already known a certain number of connectors of this type, which consist of supports in which passages are provided for receiving individual connecting contacts, of which one end is intended to come into contact with the printed-circuit board and the other end is intended to come into pressure contact with the ceramic substrate.

The speed of operation of the electronic circuits under development necessitates reducing as far as possible the length of the electrical connections in order to reduce the time periods for transit of the signals. The majority of existing connectors which achieve this condition do so only at the expense of an insufficient elasticity of the contacts, which is liable to lead to significant ohmic bearing resistances and/or to excessive pressure forces. In addition, the majority of present connectors are provided in order for the electrical junction between the printed-circuit board and the individual contacts to be produced by virtue of the pressure exerted by the contacts on the board. This solution has drawbacks, in particular that it requires each contact area on the board to be gold plated in order for the electrical connection obtained to be satisfactory.

The present invention aims to provide a connector meeting better than those previously known practical requirements, especially in that it makes it possible to reconcile the obligatory requirements of a short electrical path between printed-circuit board and module (necessary in order to diminish the transit times) and the flexibility required in order to guarantee a satisfactory contact, to take into account the manufacturing tolerances, to avoid the necessity of large bearing forces and allows a soldering of satisfactory quality.

To this end, the invention especially proposes an intermediate connector intended to be mounted on a printed-circuit board and to receive an active electronic circuit substrate by connecting contact pads provided on the lower face of the substrate to tracks on the board, comprising an insulating support in which are provided uniformly spaced passages, electrical signal contacts, each intended to connect a pad and a track and arranged in the passages, and each of which is constituted by a cut-out sheet, having a relatively rigid portion comprising a branch for bearing on the lower face of the support and for junction with a track and a branch for fastening onto the support, extending towards the upper face of the support and having a relatively flexible S-shaped portion whose proximal end is integral with the relatively rigid portion and whose distal end projects beyond the upper face of the support, the flexible portion having curvatures at rest such that the distal end is then away from the fastening branch and the passage having dimensions such that it deforms the flexible portion, when the contact is inserted into the support, until it brings the distal end into electrical junction with the fastening branch.

By virtue of this arrangement, the flexible portion may have a high flexibility guaranteeing good electrical junction with the corresponding contact pad. The short circuiting produced by the distal end coming to bear against the fastening branch ensures a junction, strengthened on installing the substrate on the connector, which guarantees a good electrical junction.

The bearing branch may without difficulty be provided in order to comprise an enlarged terminal region which can be soldered onto the board. This enlarged region may engage with a terminal engagement hook provided on the fastening branch so as to retain the contact on the support, advantageously with a vertical play.

In the definition heretofore and in the description which will follow, it should be understood that the terms "upper" and "lower" do not have to be interpreted in a limiting fashion; they simply correspond to the relative position taken by the two faces of the connector when the latter is mounted in the arrangement which is currently the most frequent.

In general, each insulating support comprises two rows of contacts. In this case, each passage may be constituted by a fraction of a slot separated by a partition from another fraction receiving a second contact. At least when the substrate is constituted by a ceramic board, the mode of manufacture of which obliges wide tolerances in the position of the contact pads to be accepted, it is advantageous to use two types of contact having bearing branches of different length. The same slot contains two different contacts, having bearing arm lengths which are different and these bearing arms being directed in opposite directions. The partitions are placed so that the arrangement of the contacts is reversed from one slot to the next. Thus the distal ends may be arranged in a staggered manner over four rows, thus permitting wider tolerances to be accepted, while the ends of the bearing branches, which may be constituted by enlarged regions, are aligned in two rows only, thus facilitating soldering by conventional techniques.

The invention will be better understood on reading the description which follows of a particular embodiment, given by way of non-limiting example. The description refers to the drawings which accompany it, in which.

Figure 1A:
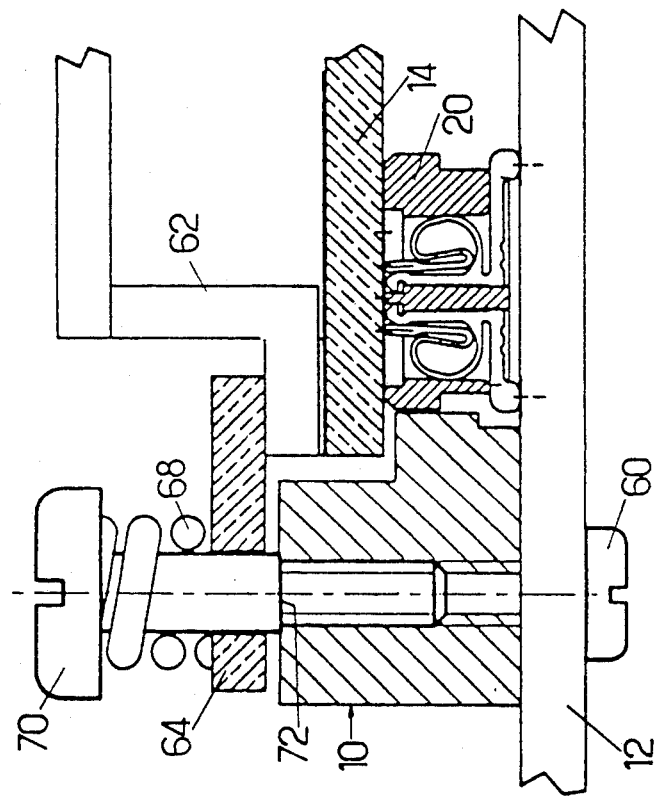
FIGS. 1A and 1B are sectional views of a fraction of a connector in accordance with a particular embodiment of the invention and of the elements which are associated with it and to which the invention relates, respectively before and after gripping of the pressure means.
Figure 1B:
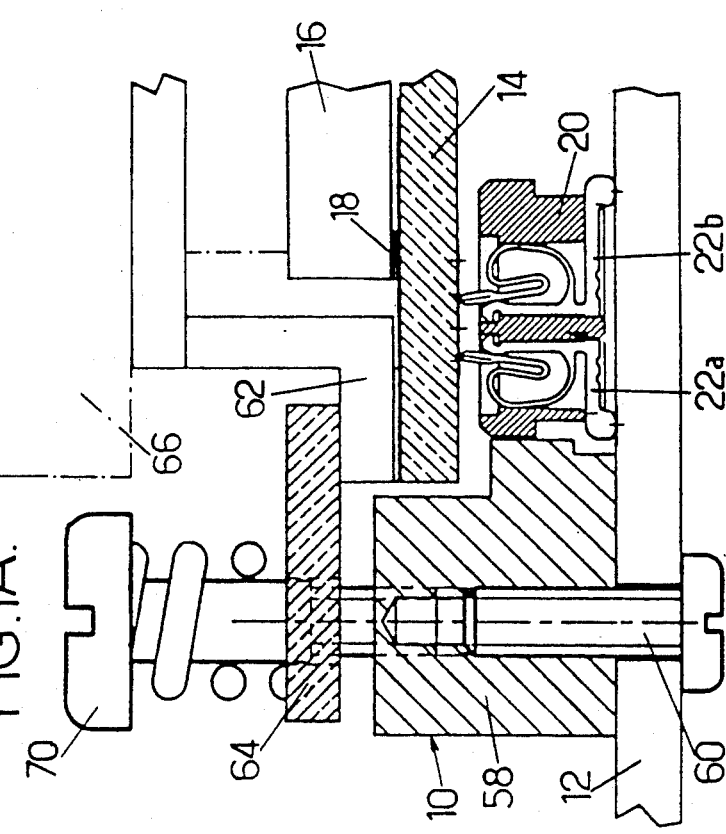
Figure 4:
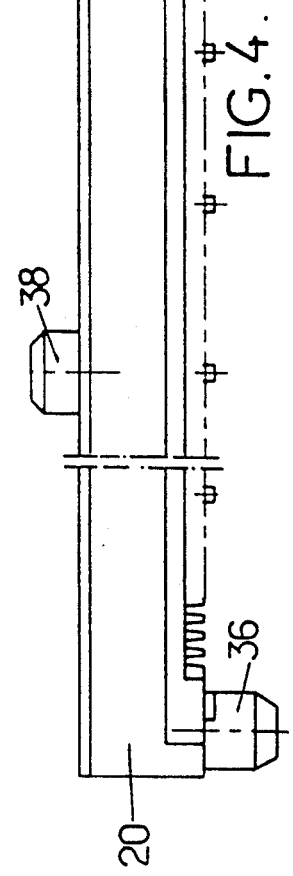
Figure 2:
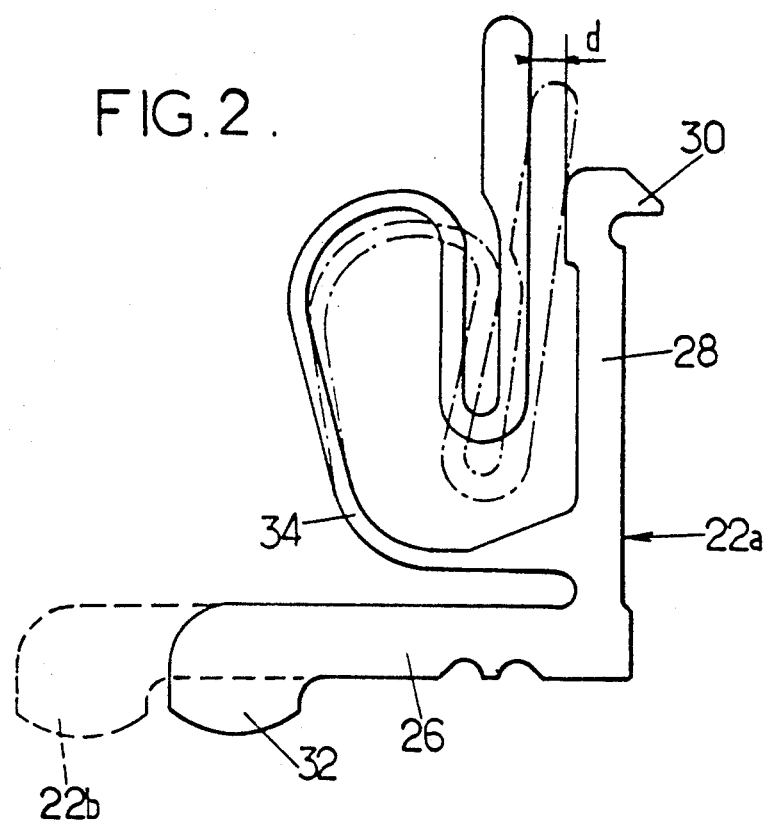
FIG. 2 is a detailed view on a large scale showing, in full lines, one of the contacts of the connector of FIG. 1 in the rest state and, in dot-dash lines, the shape assumed by this connector when it is in place in its connection strip.
Figure 3:
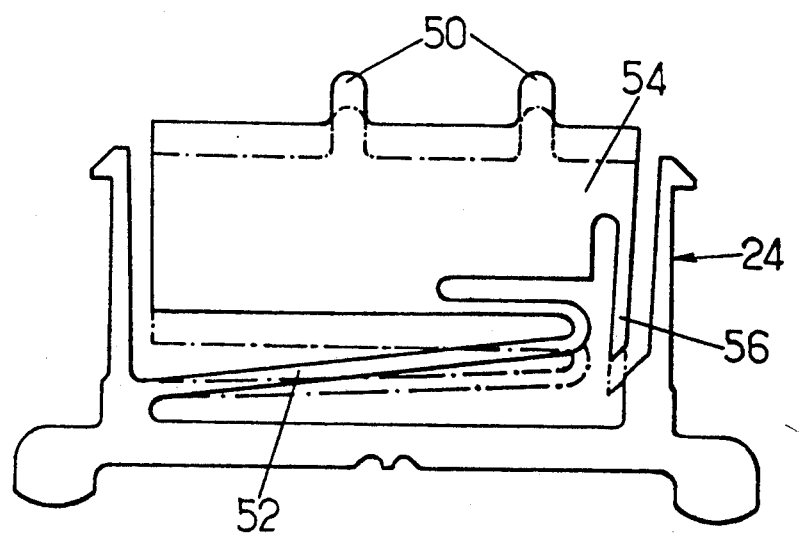

FIG. 3, similar to FIG. 2, shows an equipotential contact intended to be inserted between contacts of the type shown in FIGS. 1A and 1B;

FIG. 4 is a view, in elevation, of a connection-strip/-support for receiving contacts, which can be used in the connector shown in FIG. 1;

FIG. 5 is a plan view, on a large scale, of a fraction of the connection strip shown in FIG. 4;

FIG. 6 is a sectional view along the line VI—VI of FIG. 5, also showing a housing of the ceramic intended for receiving an alignment stud.

The connector 10 shown in FIG. 1A (before compression) and 1B (in its final state) is intended to be mounted on a printed-circuit board 12 to be connected to a substrate 14 of active electronic circuits. The substrate may especially be constituted by a multilayer ceramic board (thin film structures on which may or may not be mounted) intended for receiving several integrated-circuit chips 16 having connecting areas 18. However, the invention is also applicable when the substrate is intended to receive a single integrated circuit and is made from a material other than ceramic (for example organic).

The connector comprises an insulating support 20. In the case represented of a substrate carrying several integrated-circuit chips, this support consists of several connection strips each placed along one side of the substrate. Thus a modular construction is produced, facilitating adaptation to substrates having diverse dimensions. But the support 20 could have a frame shape, especially when it is intended for a substrate carrying a single integrated-circuit chip.

In the insulating support 20 are provided passages aligned along the connection strip and intended to receive two different kinds of contacts. The contacts 22a and 22b shown in FIGS. 1A, 1B and 2 are intended to transmit signals. The contacts 24, which can have the construction shown in FIG. 3, are intended to establish equipotential connections, for example earth or supply connections.

Each contact 22a (FIG. 2) is generally produced by cutting out from a sheet made of conductive material and having a good elasticity, for example made of beryllium bronze. It may be regarded as having a relatively rigid portion for bearing on the board and for retention in the support and a relatively flexible junction portion. The rigid portion of the contact of FIG. 2 is of right-angular shape with a branch 26 intended to extend beyond the passage in order to bear on the lower face of the support 20 and a branch 28 having a terminal hook 30 intended to rest on the upper face of the support: thus the contact, once inserted from below, is locked with a slight vertical play, visible in FIGS. 1A and 1B.

The end of the bearing branch 26 advantageously comprises an enlarged region 32 for soldering onto the board 12.

The flexible portion 34 is generally S-shaped. Its proximal end is connected up to the fastening branch 28 in the vicinity of the connecting-up with the bearing branch 26. The shape at rest of the contact 22a or 22b is such that the distal end of the flexible portion is caused to project upwardly beyond the support 20 and is at a distance d from the top end of the fastening branch 28. The shape and the dimensions specifically shown in FIG. 2 have proved to be particularly favorable.

The transverse dimensions of the reception passages in the support 20 are such that the pressure exerted by the edges of the passage brings the flexible portion into the arrangement shown by dot-dash lines in FIG. 2, that is to say into contact with the fastening branch 28, this measure not being essential however. Above all, the shape of the flexible portion 34 is such that the pressure exerted by the substrate 14 when it is brought to bear against the support 20, as shown in FIG. 1B, ensures this contacting and, possibly, the bearing of the final elbow of the flexible portion against the proximal end of this same flexible portion. A short-circuit is produced thus reducing the time for travel of the signals.

In the embodiment illustrated, two types of contacts are provided. The contacts 22b differ from the contacts 22a only by a longer bearing branch. The use of two types of contacts, in combination with a particular arrangement of the passages, enables the pads to be arranged in a staggered manner in four rows.

The support connection strip shown by way of example in the figures enables this result to be achieved. It is constituted by an elongate part made of molded insulating material, for example made of polyphenylene sulfide which has a good heat resistance, and provided with means for locating in relation to the board and in relation to the substrate 14. The means for locating in relation to the board may be constituted by studs 36 placed at the ends of the connection strip and which engage into the housings (not shown) of the board. In order to take into account the wider tolerances on the substrate, at least when it is made of ceramic, the locating means on the substrate are advantageously placed in the vicinity of the center of the connection strip. In the case illustrated in FIGS. 4 to 6, they comprise a stud 38 made as a single part with the connection strip and provided for engaging in a hole 40 of the ceramic. In order to define the bearing plane of the connection strips on the printed-circuit board, the connection strip may be provided with pads 42 (FIG. 4).

The passages for receiving signal contacts shown in FIGS. 1A, 1B and 5 are each constituted by a fraction of a slot 44 comprising a separation partition 46. FIG. 5 shows that these partitions occupy alternately one and then the other of two positions in relation to the median plane 48: the contacts which occupy the two passages of the same slot are of different types and the arrangement is reversed in two successive slots 44.

The equipotential connecting contacts 24 may have the construction shown in FIG. 3 and these contacts are also constituted from cut-out sheet and occupy slots not having a partition. They have two fastening branches and a common bearing branch, having a junction boss at each end. The relatively rigid portion is, as a consequence, generally U-shaped. Two pins 50 for contact with the substrate are carried by an arm 52 intended to ensure the required elasticity. In the case illustrated, the contact comprises a plate 54 permitting, if necessary, an impedance matching. This plate has an extension 56 for short-circuiting, by deformation of the contact 24 from the shape shown by the full lines to the shape shown by the dot-dash lines.

Means intended to apply the substrate 14 against the support 20 comprise, in the illustrated embodiment, a stiffener 58 constituting a framework fixed to the board by means of screws 60 and a movable assembly comprising a lid 62, a pressure plate 64 and calibrated elastic means. On the lid is generally provided a heat sink 66, such as a radiator, and heat-transmitting means are interposed between each of the integrated circuits 16 and the lid.

The calibrated means shown in FIG. 1B are constituted by springs 68 each placed between the pressure plate 64 and the head of a screw 70 engaged in the stiffener 58. A shoulder 72 provided on the screws limits the driving-in, and therefore the compression, of the spring 68 and, consequently, the force exerted on the substrate 14. This limitation is particularly important in the case of a relatively fragile ceramic substrate.

I claim:

1. An intermediate connector intended to be mounted on a printed-circuit board and to receive an active electronic circuit substrate by connecting contact pads provided on the lower face of the substrate to tracks of the board, comprising an insulating support in which are provided uniformly spaced passages and electrical signal contacts, each intended to connect a pad and a track and arranged in at least some of the passages, wherein the contacts are each constituted by a cut-out sheet, having a relatively rigid portion comprising a branch for bearing on the lower face of the support and for connection with a track and a branch for fastening onto the support, extending towards the upper face and having a relatively flexible S-shaped portion whose proximal end is integral with the relatively rigid portion and whose distal end projects beyond the upper face of the support, the flexible portion having curvatures at rest such that the distal end is then away from the fastening branch and the passage having dimensions such that it deforms the flexible portion when the contact is inserted into the support until it brings the distal portion into connection with the fastening branch, in order to constitute a short-circuit.

2. The connector as claimed in claim 1, wherein the bearing branch comprises an enlarged terminal region which can be soldered onto the board.

3. The connector as claimed in claim 1, wherein the passages are parallel to each other and are each constituted by a fraction of a slot provided in the support, separated by a partition from the other fraction of the slot, the second fraction receiving another signal contact.

4. The connector as claimed in claim 3, wherein the electrical contacts are of two different types, the contacts of one type having a bearing branch of a length different from that of the bearing branch of the contacts of the other type, and wherein each slot contains two contacts of different types whose bearing branches are directed in opposite directions, the partitions being placed so that the arrangement of the contacts is reversed in two successive slots in order that the distal ends are staggered over four rows while the ends for bearing onto the printed circuit are aligned in two rows.

5. The connector as claimed in claim 1, which moreover comprises equipotential contacts, each equipotential contact being constituted by a cut-out sheet occupying a passage parallel to the passages which receive the electrical signal contacts, having two fastening arms directed in opposite directions and connected to a plate provided with two contacts projecting beyond the upper face of the support, the said plate being connected via an elastic arm to the bearing branches and provided with a projection for short-circuiting the elastic arm.

6. The connector as claimed in claim 1, wherein each fastening arm comprises a terminal hook intended to engage upon the support, the distance of which to the bearing branch is such that the contact has a play within the support.

7. The connector as claimed in claim 1, wherein the support consists of connection strips arranged over all the sides of the substrate and provided with means for locating onto the printed-circuit board and onto the substrate.

8. The connector as claimed in claim 7, wherein the means for locating onto the board are placed at the ends of the connection strips and wherein the means for locating onto the substrate are placed in the middle of the connection strip.

9. The connector as claimed in claim 1, wherein the substrate is constituted by a multilayer ceramic board carrying several components.

10. The connector as claimed in claim 1, which also comprises a framework-shaped stiffener, fixed to the board and surrounding the support, and a pressure plate exerting a calibrated bearing force on the edge of the substrate via of a covering lid.

* * * * *